(12) United States Patent
Lee

(10) Patent No.: US 7,898,870 B2
(45) Date of Patent: Mar. 1, 2011

(54) NONVOLATILE MEMORY DEVICE HAVING A BIT LINE SELECT VOLTAGE GENERATOR ADAPTED TO A TEMPERATURE CHANGE

(75) Inventor: Jin-Haeng Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/790,579

(22) Filed: May 28, 2010

(65) Prior Publication Data

US 2010/0238737 A1    Sep. 23, 2010

Related U.S. Application Data

(63) Continuation of application No. 11/949,655, filed on Dec. 3, 2007, now Pat. No. 7,729,174.

(30) Foreign Application Priority Data

Feb. 14, 2007    (KR) .................. 10-2007-0015352

(51) Int. Cl.
*G11C 16/26*    (2006.01)
(52) U.S. Cl. .......... 365/185.24; 365/185.18; 365/185.17; 365/185.12

(58) Field of Classification Search ............. 365/185.17, 365/185.12, 185.11, 185.2, 185.18, 185.24
See application file for complete search history.

(56) References Cited

U.S. PATENT DOCUMENTS

| 6,611,460 | B2 | 8/2003 | Lee et al. |
| 7,729,174 | B2 * | 6/2010 | Lee .................. 365/185.24 |
| 2008/0316818 | A1 | 12/2008 | Park et al. |

FOREIGN PATENT DOCUMENTS

| KR | 100298432 B1 | 5/2001 |
| KR | 1020030079425 A | 10/2003 |
| KR | 1020070115143 A | 12/2007 |

* cited by examiner

*Primary Examiner* — Andrew Q Tran
(74) *Attorney, Agent, or Firm* — Kilpatrick Townsend & Stockton LLP

(57) ABSTRACT

A bit line select voltage generator includes a first and second voltage generators and a voltage transmission unit. The first voltage generator operates to divide a reference voltage of a reference voltage generator to generate a first voltage and a second voltage, wherein the second voltage is lower than the first voltage. The second voltage generator operates to change the first voltage according to change of temperatures thereby generating a third voltage. The voltage transmission unit operates to transmit the second voltage or the third voltage to an output terminal according to a voltage level of a first voltage transmit control signal or a second voltage transmit control signal.

9 Claims, 2 Drawing Sheets

NONVOLATILE MEMORY DEVICE HAVING A BIT LINE SELECT VOLTAGE GENERATOR ADAPTED TO A TEMPERATURE CHANGE

CROSS-REFERENCES TO RELATED APPLICATIONS

The present application is a continuation of U.S. patent application Ser. No. 11/949,655, filed on Dec. 3, 2007, which claims priority to Korean patent application number 10-2007-15352, filed on Feb. 14, 2007, both of which are incorporated by reference in their entirety.

BACKGROUND OF THE INVENTION

The present invention relates to a bit line select voltage generator used in nonvolatile memory devices and a data read method of a nonvolatile memory device using the same.

Recently, there is an increasing demand for nonvolatile memory devices, enabling an electrical program and erase without requiring a refresh function.

A nonvolatile memory device generally includes a memory cell array in which cells having data stored therein are arranged in matrix form, and a page buffer for writing data into specific cells of the memory cell array or reading data stored in a specific cell. The page buffer includes a bit line pair connected to a specific memory cell, a register for temporarily storing data, which will be written into the memory cell array or read from a specific cell in the memory cell array, a sensing node for sensing a voltage level of a specific bit line or a specific register, and a bit line select unit for controlling whether the specific bit line and the sensing node are connected.

In the memory cells of the nonvolatile memory device, stored data are varied depending on a threshold voltage value. It is thus important to stably maintain the threshold voltage. In particular, in recent years, distributions of the threshold voltage are set in various fields to which a multi-level cell programming method is applied. It becomes even more important to stably maintain the distributions in this instance.

However, the distributions of the threshold voltage vary depending on external conditions such as temperature. It is therefore necessary to provide a nonvolatile memory devices in which the distributions of the threshold voltage can be controlled stably irrespective of a temperature variation.

BRIEF SUMMARY OF THE INVENTION

The present invention is directed towards a bit line select voltage generator, in which a select voltage of a bit line, which is applied at the time of a read operation of a nonvolatile memory device, is varied according to an increase or decrease of a temperature.

The present invention further discloses a data read method of a nonvolatile memory device employing the bit line select voltage generator.

In one embodiment, a bit line select voltage generator includes a first voltage generator, a second voltage generator, and a voltage transmission unit. The first voltage generator is configured to divide a reference voltage of a reference voltage generator, generate a control voltage, and generate a first voltage in response to the control voltage. In this case, the first voltage is raised according to an increase of a temperature and output. The second voltage generator is configured to divide the reference voltage and generate a second voltage of a level lower than that of the first voltage. The voltage transmission unit is configured to transmit the first voltage or the second voltage to an output terminal according to a voltage level of a first voltage transmit control signal or a second voltage transmit control signal.

In another embodiment, a data read method of a nonvolatile memory device includes applying a bit line select voltage of a first voltage level in order to precharge a specific bit line, connected to a specific cell to be read, to a high level, turning on a drain select transistor to connect a cell string, including a specific memory cell, to the specific bit line, applying a voltage of a low level to a word line connected to the specific memory cell, and applying a voltage of a high level to the remaining word lines, turning on a source select transistor to connect one terminal of the cell string to a common source line connected to a ground power supply, applying a bit line select voltage of a second voltage level lower than the first voltage in order to connect a specific bit line, connected to a specific cell to be read, to a sensing node, and evaluating whether the memory cell to be read has been programmed according to a variation in a voltage level of each bit line. The bit line select voltage is applied so that a difference between the first voltage and the second voltage increases according to an increase of a temperature.

DESCRIPTION OF SPECIFIC EMBODIMENTS

Specific embodiments according to the present patent will be described with reference to the accompanying drawings.

Figure 1:
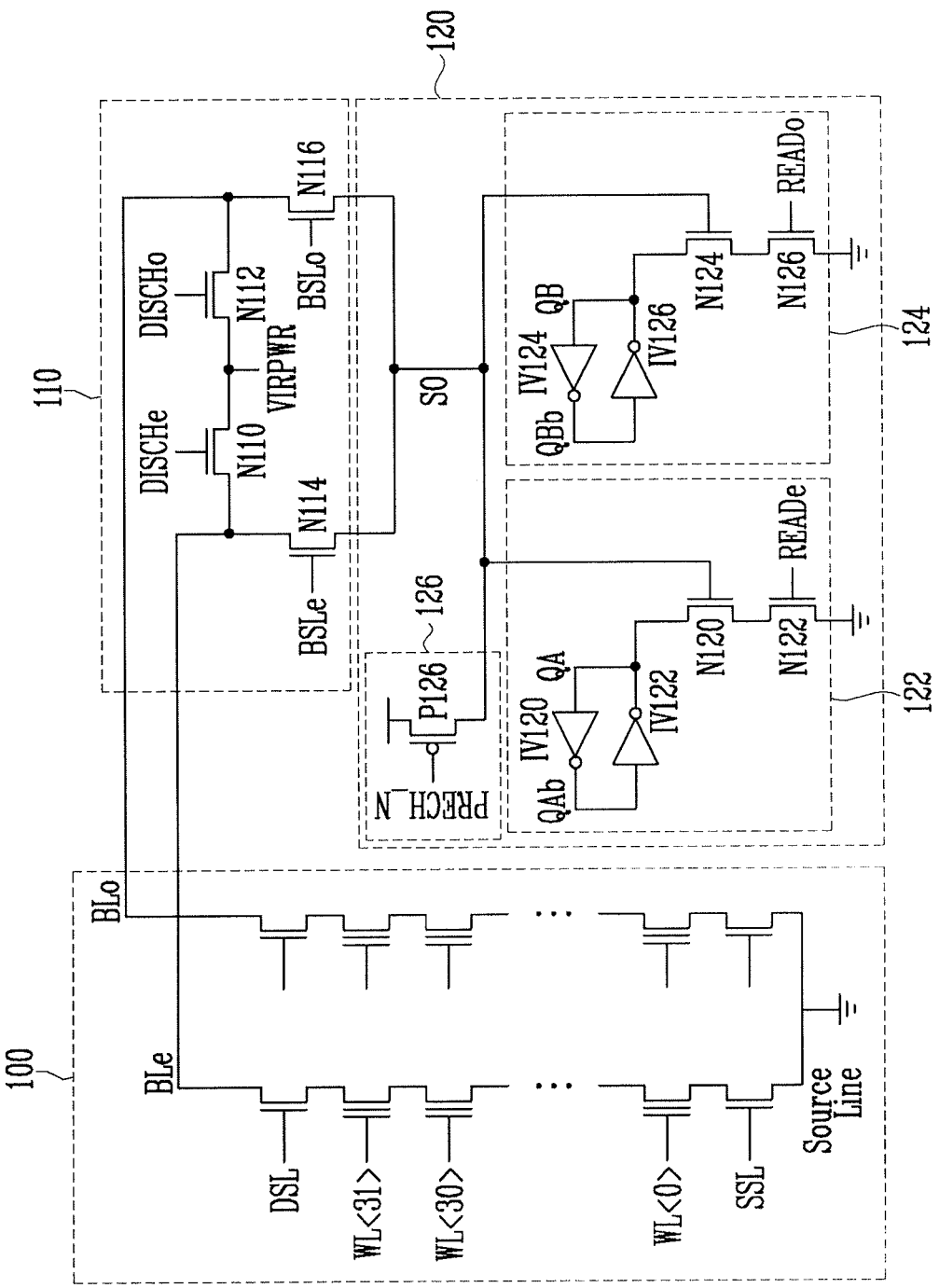
FIG. 1 is a circuit diagram illustrating a construction of a nonvolatile memory device according to the present invention.

FIG. 1 is a circuit diagram illustrating a construction of a nonvolatile memory device according to the present invention.

The nonvolatile memory device includes a memory cell array 100, an even bit line BLe and an odd bit line BLo connected to the memory cell array, a register unit 120 having a first register 122 and a second register 124 for storing specific data, a sensing node SO connected to the bit lines BLe, BLo and the registers 122, 124 and configured to sense a voltage level of a specific bit line or a voltage level of specific registers, a precharge unit 126 for precharging the sensing node SO to a certain voltage level, and a page buffer including a bit line select unit 110 for connecting the specific bit line BLe or BLo and the sensing node SO.

The memory cell array 100 includes memory cells for storing data, word lines for selecting and activating the memory cells, and the bit lines BLe, BLo into/from which data of the memory cells can be input/output. The memory cell array 100 has a structure in which the plurality of word lines and the plurality of bit lines are arranged in matrix form. The memory cell array 100 includes memory cells of a string structure, which are connected in series between a source select transistor SSL and a drain select transistor DSL. The gates of the memory cells are connected to the word lines. A collection of memory cells commonly connected to the same word line is referred to as a page. A plurality of strings connected to respective bit lines are connected in parallel to a common source line, thus forming a block.

The bit line select unit 110 includes a control signal input stage for applying a control signal VIRPWR of a specific voltage level to the bit line BLe or BLo. The bit line select unit 110 is configured to apply the control signal to an even bit line in response to an even discharge signal DISCHe, or the control signal to an odd bit line in response to an odd discharge signal DISCHo.

To this end, the bit line select unit 110 includes a NMOS transistor N110 having one terminal connected to the control signal input stage and configured to apply the control signal VIRPWR to the even bit line BLe in response to the even discharge signal DISCHe, and a NMOS transistor N112 having one terminal connected to the control signal input stage and configured to apply the control signal VIRPWR to the odd bit line BLo in response to the odd discharge signal DISCHo.

The bit line select unit 110 further includes a NMOS transistor N114 or N116 for connecting the bit line BLe or BLo and the sensing node SO in response to a bit line select voltage BSLe or BSLo.

The precharge unit 126 includes a PMOS transistor P126 for connecting the sensing node SO and a power supply voltage in response to a precharge signal PRECH_N.

The first register 122 and the second register 124, included in the register unit 120, function to temporarily store corresponding data according to the voltage level of the sensing node in an operation for reading data stored in a specific memory cell array, and also temporarily store corresponding data in an operation for programming the externally input data into the specific memory cell array.

The first register 122 includes a latch having two inverters IV120, IV122 for temporarily storing data, a NMOS transistor N120 connected to a node of the latch and configured to turn on in response to the voltage level of the sensing node, and a NMOS transistor N122 connected between the NMOS transistor and a ground power supply and configured to transfer a ground voltage to the latch in response to a first read signal READe.

The second register 124 includes a latch having two inverters IV124, IV126 for temporarily storing data, a NMOS transistor N124 connected to a node of the latch and configured to turn on in response to the voltage level of the sensing node, and a NMOS transistor N126 connected between the NMOS transistor and a ground power supply and configured to transfer a ground voltage to the latch in response to a second read signal READo.

Figure 2:
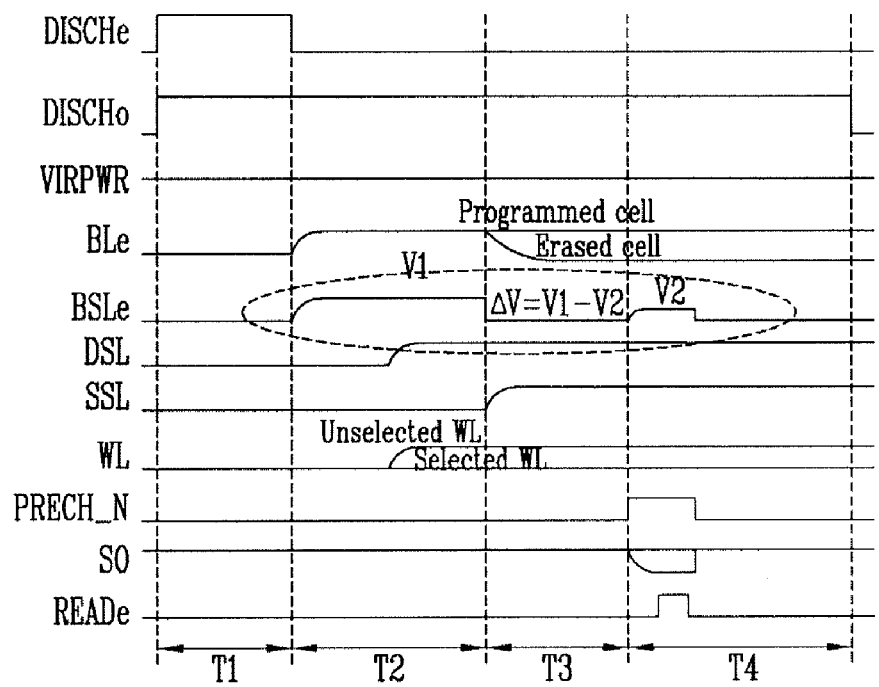
FIG. 2 is a waveform illustrating a read operation on the nonvolatile memory device.

FIG. 2 is a waveform illustrating a read operation on the nonvolatile memory device of FIG. 1.

1) T1 Period: Bit Line Discharge Period

The discharge signal DISCHe or DISCHo of a high level is applied to the gate of the NMOS transistor N110 or N112 of the bit line select unit 110 to turn on the NMOS transistor N110 or N112. The verification signal VIRPWR is applied to the bit line BLe or BLo through the turn-on transistor N110 or N112. At the time of a read operation, the verification signal VIRPWR is kept to a voltage 0V, so that the voltage 0V is applied to the bit line BLe or BLo.

2) T2 Period: Bit Line Precharge Period

The discharge signal DISCHe of a low level is applied to the gate of the NMOS transistor N112 of the bit line select unit 110 to turn off the NMOS transistor N112. Thus, the bit line BLe is precluded from the verification signal VIRPWR that is kept to a voltage of 0V.

The precharge signal PRECHb of a low level is applied to the gate of the PMOS transistor P126 of the precharge unit 126 to turn on the PMOS transistor P126. Accordingly, the power supply voltage Vcc is applied to the sense line SO, which is thus kept to a high level. If the bit line select voltage BSLe is applied to the gate of the NMOS transistor N114 of the bit line select unit 110 as a voltage level of a first voltage V1 and the bit line select voltage BSLo of a low level is applied to the gate of the NMOS transistor N116 of the bit line select unit 110, the bit line BLe is applied with a voltage (V1−Vt) in which the threshold voltage Vt of the NMOS transistor N3 is subtracted from the first voltage V1.

Further, a drain select signal of a high level is applied to the gate of the drain select transistor DSL to connect a specific cell string and a specific bit line.

3) T3 Period: Cell Evaluation

As the bit line select voltage BSLe of a low level is applied to the gate of the NMOS transistor N114 of the bit line select unit 110 to turn off the NMOS transistor N114, the voltage level of the bit line BLe is changed by a state of a memory cell connected to the bit line BLe. Thus, when the memory cell is a program cell, the voltage level of the bit line BLe is kept at the voltage level V1−Vt. When the memory cell is an erase cell, the voltage level of the bit line BLe gradually decreases from the voltage level V1−Vt, and is then kept to a low level.

The source select signal of a high level is applied to the gate of the source select transistor SSL to connect a specific cell string and the common source line.

4) T4 Period: Bit Line Evaluation

Before the bit line select voltage BLSe of a high level is applied to the gate of the NMOS transistor N114 of the bit line select unit 110, the precharge signal PRECHb of a high level is applied to the gate of the PMOS transistor P126 of the precharge unit 126, thus turning off the PMOS transistor P126. Accordingly, the supply of power of a high level to the sensing node and a specific bit line is stopped.

As the bit line select voltage BLSe is applied to the gate of the NMOS transistor N114 as a voltage level of a second voltage V2, the NMOS transistor N114 is turned on. At this time, the second voltage V2 has a voltage value to the extent that the voltage level of a bit line can be applied to the sense line SO, and generally has a value smaller than the first voltage V1.

In this case, when a memory cell is a program cell, the voltage level of the bit line BLe is kept at the voltage level of V1−Vt and a voltage level of the sense line SO is kept to a high level. However, when the memory cell is an erase cell, the voltage level of the bit line BLe gradually decreases and is then kept to a low level, and the voltage level of the sense line SO is kept to a low level. Thereafter, a first read signal READe of a high level is applied to the NMOS transistor N122 and the NMOS transistor N120 is driven by the voltage level of the sense line SO. Accordingly, data are stored in the latch according to the voltage level of the sense line SO.

In this read operation, a variation in the threshold voltage of a cell depending on the voltages V1, V2 applied to the bit line select voltage BLSe is described below. First, as a difference between V1 and V2 (i.e., the value of V1−V2) decreases, the threshold voltage of the cell, which is sensed by the page buffer, rises. As the value of V1−V2 increases, the threshold voltage decreases.

Second, the threshold voltage of a cell, which is sensed by the page buffer as an external temperature rise, is low compared with a case where the temperature is low. Thus, program is performed at a higher threshold voltage.

It is thus sought to minimize a variation in the threshold voltage of a cell according to a temperature change by applying the two principles.

In other words, in the case of a high temperature, program has been performed at a high threshold voltage. In order to lower the high threshold voltage, the voltage V1 is raised to increase the value of V1−V2.

In the case of a low temperature, program has been performed at a low threshold voltage. In order to raise the low threshold voltage, the voltage V1 is lowered to reduce the value of V1−V2.

As described above, a regulator is constructed such that the bit line select voltage V1 is influenced by a variation in temperature. The bit line select voltage generator is constructed so that it is controlled to raise the bit line select voltage V1 when a temperature rises and lower the bit line select voltage V1 when a temperature lowers.

Figure 3:
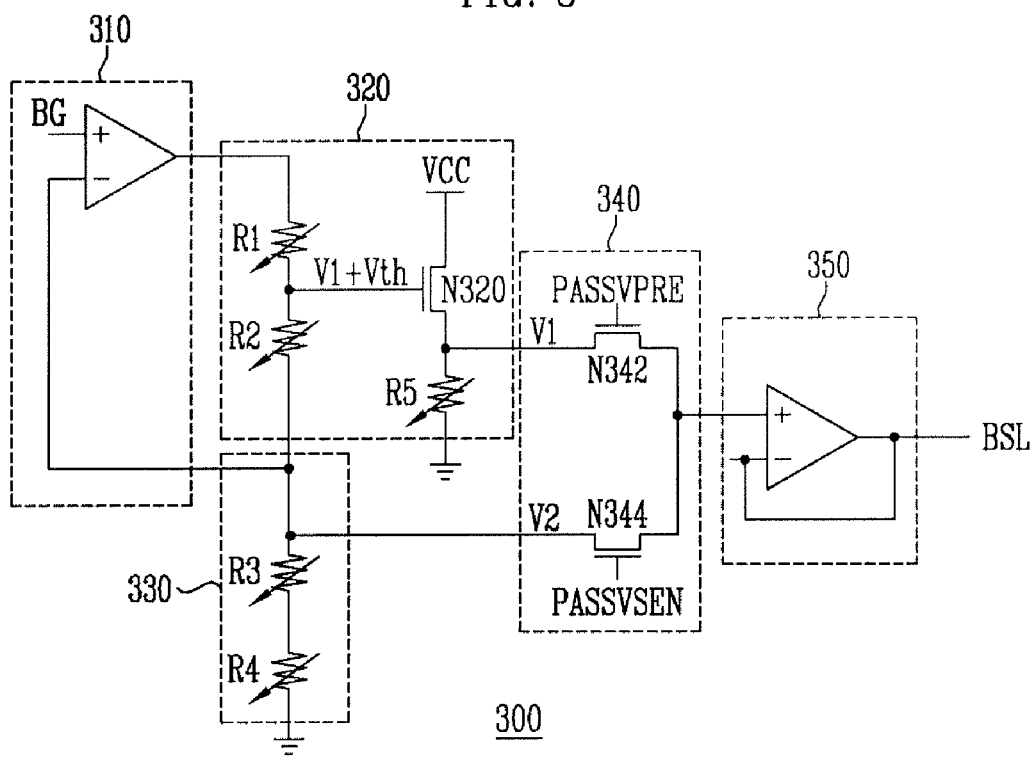
FIG. 3 is a detailed circuit diagram illustrating a bit line select voltage generator according to an embodiment of the present invention.

FIG. 3 is a detailed circuit diagram illustrating a bit line select voltage generator according to an embodiment of the present invention.

A bit line select voltage generator 300 includes a reference voltage generator 310, a first voltage (V1) generator 320, a second voltage (V2) generator 330, a first voltage (V1) transmitter 340, a second voltage (V2) transmitter 350, and a buffer unit 350.

The reference voltage generator 310 is configured to output a reference voltage such that voltages are generated from the first voltage (V1) generator 320 and the second voltage (V2) generator 330 through voltage dividing. To this end, the reference voltage generator 310 includes a bandgap circuit that outputs the reference voltage.

The first voltage (V1) generator 320 is configured to divide the reference voltage of the reference voltage generator 310, generate a control voltage, and generate the first voltage in response to the control voltage, but raise and output the first voltage according to an increase in temperature.

To this end, the first voltage generator includes variable resistors R1, R2 connected in series to each other and configured to divide the reference voltage and output the control voltage, and a NMOS transistor having a gate to which the control voltage is input, a drain to which the power supply voltage is input, and a source from which the first voltage V1 is output. At this time, the control voltage is output from a connection node of the variable resistors R1, R2.

The control voltage may be controlled to set each device value of the variable resistors R1, R2 such that it becomes the sum V1+Vth of the first voltage and the threshold voltage of the switching element.

The first voltage (V1) generator 320 further includes a variable resistor R5 connected between the source of a NMOS transistor N320 and a ground terminal. Accordingly, the first voltage V1 is output in response to the control voltage V1+Vth. Meanwhile, according to the above construction, in the case of a high temperature, the first voltage V1 further rises, and in the case of a low temperature, the first voltage V1 further decreases.

This process is described in more detail below. If a temperature rises, the threshold voltage Vth of the switching element further lowers and, therefore, the output first voltage V1 further rises. If a temperature lowers, the threshold voltage Vth of the switching element further rises and, therefore, the output first voltage V1 further lowers.

The second voltage generator 330 includes a plurality of variable resistors R3, R4 connected in series between the first voltage generator 320 for dividing the reference voltage (i.e., the output of the bandgap voltage generator 310), and a ground power supply. Thus, the second voltage V2 is output from a connection node of the first voltage generator 320 and the variable resistor R3. Meanwhile, a connection node of the first voltage generator 320 and the variable resistor R3 is connected to an inverting terminal of an OP amp included in the bandgap voltage generator 310.

The voltage transmission unit 340 includes a first NMOS transistor N342 for transmitting the first voltage V1 to an output terminal thereof in response to a first voltage transmit control signal PASSVPRE of a high level, and a second NMOS transistor N344 for transmitting the second voltage V2 to an output terminal thereof in response to a second voltage transmit control signal PASSVSEN of a high level.

Thus, the first voltage V1 or the second voltage V2 is transmitted to the buffer unit 350 according to a voltage level of the control signal PASSVPRE or PASSVSEN. Meanwhile, the NMOS transistors N342, N344 have the output terminals connected to each other and then connected to the buffer unit 350.

The buffer unit 350 receives the output of the voltage transmission unit 340 and outputs it as a bit line select voltage. That is, the buffer unit 350 serves as a buffer so that the generated first or second voltage V1 or V2 is supplied stably as the bit line select voltage BSLe or BSLo. To this end, the buffer unit 350 includes an OP amp. The OP amp has a non-inverting terminal (+) connected to the output terminal of the voltage transmission unit 340 and an inverting terminal (−) connected to an output terminal of the OP amp.

In other words, the bit line voltage generator 300 constructed above is configured to output the first voltage V1 whose voltage level varies according to a variation in temperature. When a temperature is high, the bit line voltage generator 300 controls the first voltage V1 to rise, and when a temperature is low, the bit line voltage generator 300 controls the first voltage V1 to lower, so that a difference between the first voltage V1 and the second voltage V2 is entirely controlled according to a temperature change.

A read operation of a nonvolatile memory device employing the voltage of the bit line, which is output to the bit line voltage generator 300 constructed above, is performed as follows.

The bit lines are discharged to a low level.

A detailed operating method thereof is the same as that regarding the T1 period of the description about the embodiment of FIG. 2.

In order to precharge a specific bit line, which is connected to a specific cell to be read, to a high level, the bit line select voltage of the first voltage level is applied.

A detailed operating method thereof is similar to that regarding the T2 period of the description about the embodiment of FIG. 2.

However, the bit line select voltage is applied such that a difference between the first voltage and the second voltage increases according to an increase of a temperature.

The first voltage V1 may be controlled to rise as a temperature rises, and the first voltage V1 may be controlled to lower as a temperature falls.

For this purpose, the first voltage transmit control signal PASSVPRE of a high level is applied, and the bit line select voltage of the first voltage level, which is output from the bit line voltage generator 300, is applied.

The drain select transistor is turned on to connect a cell string in which a specific memory cell to be read is included and the specific bit line.

A detailed operating method thereof is the same as that regarding the T2 period of the description about the embodiment of FIG. 2.

A voltage of a low level is applied to a word line connected to the specific memory cell, and a voltage of a high level is applied to the remaining word lines.

A detailed operating method thereof is the same as that regarding the T2 period of the description about the embodiment of FIG. 2.

The source select transistor is turned on to connect one terminal of the cell string to the common source line connected to the ground power supply.

A detailed operating method thereof is the same as that regarding the T3 period of the description about the embodiment of FIG. 2.

In order to connect a specific bit line connected to a specific cell to be read and the sensing node, the bit line select voltage of the second voltage level is applied.

A detailed operating method thereof is similar to that regarding the T3 period of the description about the embodiment of FIG. 2.

However, in order to apply the bit line select voltage of the second voltage level, the second voltage transmit control signal PASSVSEN of a high level is applied and the bit line select voltage of the second voltage level, which is output from the bit line voltage generator 300, is thus applied.

Thereafter, whether a memory cell to be read has been programmed is evaluated according to a variation in a voltage level of each bit line.

A detailed operating method thereof is the same as that regarding the T4 period of the description about the embodiment of FIG. 2.

As described above, according to the present invention, when an external temperature is high, a first voltage supplied as a bit line select voltage during a read operation of a nonvolatile memory device can be increased so that a threshold voltage is decreased. When an external temperature is low, the first voltage can be decreased so that the threshold voltage rises. Accordingly, a nonvolatile memory device which can reduce a variation in a threshold voltage according to a temperature change and has distributions of a stable threshold voltage can be provided.

Although the foregoing description has been made with reference to the specific embodiments, it is to be understood that changes and modifications of the present patent may be made by the ordinary skilled in the art without departing from the spirit and scope of the present patent and appended claims.

What is claimed is:

1. A bit line select voltage generator, comprising:
   a first voltage generator for dividing a reference voltage of a reference voltage generator to generate a first voltage and a second voltage, wherein the second voltage is lower than the first voltage;
   a second voltage generator for changing the first voltage according to change of temperatures thereby generating a third voltage; and
   a voltage transmission unit for transmitting the second voltage or the third voltage to an output terminal according to a voltage level of a first voltage transmit control signal or a second voltage transmit control signal.

2. The bit line select voltage generator of claim 1, wherein the first voltage generator comprises variable resistors connected in series and configured to divide the reference voltage and output the first voltage.

3. The bit line select voltage generator of claim 2, wherein the second voltage generator comprises a NMOS transistor having a gate configured to receive the first voltage, a drain configured to receive a power supply voltage, and a source configured to output the third voltage.

4. The bit line select voltage generator of claim 3, wherein a resistance value of the variable resistors is set such that the first voltage is a sum of the third voltage and a threshold voltage of the NMOS transistor.

5. The bit line select voltage generator of claim 1, wherein the second voltage generator lowers and outputs the third voltage as the temperature falls.

6. The bit line select voltage generator of claim 1, wherein the first voltage generator comprises variable resistors connected in series and configured to divide the reference voltage and output the second voltage.

7. The bit line select voltage generator of claim 1, wherein the voltage transmission unit comprises:
   a first NMOS transistor for transmitting the third voltage to the output terminal in response to the first voltage transmit control signal of a high level; and
   a second NMOS transistor for transmitting the second voltage to the output terminal in response to the second voltage transmit control signal of a high level.

8. The bit line select voltage generator of claim 1, further comprising a buffer unit for receiving an output of the voltage transmission unit and outputting the output as a bit line select voltage.

9. A bit line select voltage generator, comprising:
   a first voltage generator for outputting a first voltage and a second voltage;
   a second voltage generator for generating a third voltage by changing the first voltage in response to a temperature; and
   a voltage transmission unit for transmitting the third voltage to a bit line selection unit to precharge a bit line of a memory device in response to a first control signal or transmitting the second voltage to the bit line selection unit to evaluate the bit line in response to a second control signal.

* * * * *